(12) United States Patent
Chung et al.

(10) Patent No.: US 8,981,784 B2
(45) Date of Patent: Mar. 17, 2015

(54) METHOD FOR MANUFACTURING A COMPOSITE BUSHING, AND PARTIAL DISCHARGE DIAGNOSTIC SYSTEM FOR COMPOSITE BUSHING

(75) Inventors: Young Soo Chung, Gyeonggi-do (KR); Dong Woen Lee, Gyeonggi-do (KR); Jung Bae Kim, Gyeonggi-do (KR)

(73) Assignee: Hyosung Corporation, Gyeonggi-Do (KR)

( * ) Notice: Subject to any disclaimer, the term of this patent is extended or adjusted under 35 U.S.C. 154(b) by 930 days.

(21) Appl. No.: 13/143,076

(22) PCT Filed: Dec. 24, 2009

(86) PCT No.: PCT/KR2009/007796
§ 371 (c)(1),
(2), (4) Date: Oct. 3, 2011

(87) PCT Pub. No.: WO2010/077024
PCT Pub. Date: Jul. 8, 2010

(65) Prior Publication Data
US 2012/0036677 A1 Feb. 16, 2012

(30) Foreign Application Priority Data

Dec. 30, 2008 (KR) .................. 10-2008-0136666

(51) Int. Cl.
*G01R 31/00* (2006.01)
*H01H 33/26* (2006.01)
*H01B 19/04* (2006.01)
*G01R 31/12* (2006.01)
(Continued)

(52) U.S. Cl.
CPC ............... *H01H 33/26* (2013.01); *H01B 19/04* (2013.01); *G01R 31/1245* (2013.01); *H02B 13/065* (2013.01); *H01B 17/005* (2013.01)
USPC .................................. 324/500; 16/2.1; 29/428

(58) Field of Classification Search
CPC ...... H01B 17/005; H01B 19/04; H01H 33/26; H02B 13/065
USPC ................ 16/2.1; 29/458; 324/415, 500, 501; 361/605, 612, 618
See application file for complete search history.

(56) References Cited

U.S. PATENT DOCUMENTS

| 5,017,447 | A | * | 5/1991 | Wallner et al. ..................... 430/2 |
| 5,834,110 | A | | 11/1998 | Misawa et al. |
| 6,242,902 | B1 | | 6/2001 | Smith |

(Continued)

FOREIGN PATENT DOCUMENTS

| CN | 1340718 A | 3/2002 |
| EP | 1 202 293 A1 | 5/2002 |

(Continued)

OTHER PUBLICATIONS

Search Report dated Nov. 29, 2013 for EP Application No. 09836345 filed Dec. 24, 2009, 7 pages.

*Primary Examiner* — Jacob Cigna
(74) *Attorney, Agent, or Firm* — Patterson Thuente Pedersen, P.A.

(57) ABSTRACT

Disclosed are a method of manufacturing a composite bushing and a diagnostic system for the partial discharge of the composite bushing that may provide a thin-film ultra high frequency (UHF) sensor to a composite bushing, thereby measuring a partial discharge of a composite bushing and preventing a safety accident of the composite bushing that may occur due to the partial discharge.

7 Claims, 4 Drawing Sheets

(51) Int. Cl.
*H02B 13/065* (2006.01)
*H01B 17/00* (2006.01)

(56) References Cited

U.S. PATENT DOCUMENTS

| | | | |
|---|---|---|---|
| 6,850,399 B1 * | 2/2005 | Kato et al. | 361/93.1 |
| 7,854,058 B2 * | 12/2010 | Schreiber et al. | 29/622 |
| 2003/0112569 A1 * | 6/2003 | Kato et al. | 361/93.1 |
| 2005/0135028 A1 * | 6/2005 | Kato et al. | 361/64 |
| 2005/0135029 A1 * | 6/2005 | Kato et al. | 361/64 |

FOREIGN PATENT DOCUMENTS

| | | | |
|---|---|---|---|
| EP | 1202293 A1 * | | 5/2002 |
| JP | 02083463 A * | | 3/1990 |
| JP | 03-135311 | | 6/1991 |
| JP | 2001-141773 | | 5/2001 |
| JP | 2001141773 A * | | 5/2001 |
| JP | 2002-071743 | | 3/2002 |
| JP | 2002071743 A * | | 3/2002 |
| KR | 10-2008-0095694 A | | 10/2008 |

* cited by examiner

US 8,981,784 B2

METHOD FOR MANUFACTURING A COMPOSITE BUSHING, AND PARTIAL DISCHARGE DIAGNOSTIC SYSTEM FOR COMPOSITE BUSHING

PRIORITY CLAIM

The present application is a National Phase entry of PCT Application No. PCT/KR2009/007796, filed Dec. 24, 2009, which claims priority from Korean Application No 10-2008-0136666, filed Dec. 30, 2008, the disclosures of which are hereby incorporated by reference herein in their entirety.

TECHNICAL FIELD

The present invention relates to a method of manufacturing a composite bushing and a diagnostic system for the partial discharge of the composite bushing, and more particularly, to a method of manufacturing a composite bushing and a diagnostic system for the partial discharge of the composite bushing that may provide a thin-film ultra high frequency (UHF) sensor within a fiberglass reinforced plastics (FRP) tube, thereby inspecting a partial discharge of a composite bushing.

BACKGROUND OF THE INVENTION

In general, a Gas Insulated Switchgear (GIS) corresponds to a device that is provided to a power transmission line or a power distribution line to open and close a line in a normal state and in an abnormal state, for example, a ground, a short, and the like, thereby safely protecting a power system.

In the GIS, a composite bushing used by filling sulphur hexafluoride ($SF_6$) gas therein generally includes a flange and a fiberglass reinforced plastics (FRP) tube and a silicon rubber to be inserted into the flange.

To enhance the air-tightness of the sulphur hexafluoride ($SF_6$) gas, the inner circumferential surface of the flange may be processed to be rough. In this case, an adhesive surface may be worn out or be damaged due to a temperature change. Accordingly, there may be some constraints in maintaining the gas air-tightness.

When a discharge is initiated in a bushing that is one of constituent parts of the GIS, wideband electromagnetic waves may occur. In the case of a partial discharge, a cause of the partial discharge may be removed whereby the partial discharge may disappear over time. However, in many cases, a number of times of discharge, a discharge strength, and the like, may increase, which may result in generating a flashover. Here, the flashover indicates a phenomenon that a sparkler instantaneously occurs and thereby current flows.

Accordingly, when the partial discharge of the GIS in operation is measured outside, it is possible to prevent the flashover from occurring and an ultra high frequency (UHF) of a partial discharge measurement sensor has been employed as such measurement unit.

Even though the partial discharge of the bushing needs to be measured by providing the above UHF sensor to the bushing, it may be difficult to install the UHF sensor in a bushing that is generally formed in a magnetism type or an insulator type.

Also, even in the case of using the composite bushing, the composite bushing may be externally exposed and thus, there are some constraints on an area required to install the UHF sensor. Due to noise around the composite bushing, it may be difficult for the UHF sensor to accurately measure the partial discharge.

Also, when the partial discharge of the composite bushing continues, flashover may explode the bushing and injury to personnel may occur.

SUMMARY OF THE INVENTION

An aspect of embodiments of the present invention provides a method of manufacturing a composite bushing and a diagnostic system for the partial discharge of the composite bushing that may provide a thin-film ultra high frequency (UHF) sensor to a composite bushing and thereby measure a partial discharge of the composite bushing.

Another aspect of embodiments of the present invention provides a method of manufacturing a composite bushing and a diagnostic system for the partial discharge of the composite bushing that may provide a reduced thin-film UHF sensor to a composite bushing and thereby readily install the UHF sensor in the composite bushing.

Still another aspect of embodiments of the present invention provides a method of manufacturing a composite bushing and a diagnostic system for the partial discharge of the composite bushing that may measure a partial discharge by providing a thin-film UHF sensor to a composite bushing, thereby preventing a safety accident of the composite bushing.

According to an aspect of embodiments of the present invention, there is provided a method of manufacturing a composite bushing, the method including: providing a fiberglass reinforced plastics (FRP) tube; performing primer coating on the FRP tube; providing a thin-film ultra high frequency (UHF) sensor within the FRP tube; and providing a silicon rubber on the thin-film UHF sensor.

According to the above method, it is possible to measure the partial discharge occurring in the composite bushing, and to prevent a safety accident of the composite bushing from occurring due to the partial discharge.

In the providing the FRP tube, the FRP tube may be formed in a circular shape or an oval shape. The FRP tube formed in the circular shape or the oval shape enables the thin-film UHF sensor to be readily provided to the FRP tube.

The providing the thin-film UHF sensor may include withdrawing an output line of the thin-film UHF sensor. The withdrawing the output line of the thin-film UHF sensor may include withdrawing an anode receiver output line and a cathode receiver output line. Each of the anode receiver output line and the cathode receiver output line may be connected to a Bayonet Neil-Concelman (BNC) connector.

In the connecting, the cathode receiver output line may be electrically separated from the BNC connector and the anode receiver output line may be electrically connected to the BNC connector.

Accordingly, the output line of the thin-film UHF sensor may be connected to a flange of the composite bushing whereby the thin-film UHF sensor may maintain a ground state and thereby measure the partial discharge of the composite bushing.

According to another aspect of embodiments of the present invention, there is provided a diagnostic system for a partial discharge of a composite bushing, the system including: the composite bushing including an FRP tube, a thin-film UHF sensor being provided on the FRP tube, and a silicone rubber being provided on the thin-film UHF sensor; and an output unit being electrically connected to the thin-film UHF sensor to output a signal of the thin-film UHF sensor.

Using the thin-film UHF sensor provided to the composite bushing constructed as above, it is possible to measure the partial discharge occurring in the composite bushing, to prevent the safety accident of the composite bushing, and to enhance a reliability.

The FRP tube may be formed in a circular shape or an oval shape, and be primer coated for stable attachment with the silicone rubber.

Also, the output unit may withdraw an anode receiver output line and a cathode receiver output line of the thin-film UHF sensor. Each of the anode receiver output line and the cathode receiver output line may be connected to a BNC connector to sense the partial discharge of the composite bushing. The cathode receiver output line may be earthed with a flange of the composite bushing.

The thin-film UHF sensor may be installed in an upper end of a lower flange of the FRB tube. Since the thin-film UHF sensor is installed in the upper end of the lower flange of the FRB tube, it is possible to readily install the thin-film UHF sensor in the composite bushing.

The thin-film UHF sensor may be formed in the shape of a band.

According to embodiments of the present invention, there may be provided a method of manufacturing a composite bushing and a diagnostic system for the partial discharge of the composite bushing that may provide a thin-film ultra high frequency (UHF) sensor to a composite bushing and thereby measure a partial discharge of the composite bushing.

Also, according to embodiments of the present invention, there may be provided a method of manufacturing a composite bushing and a diagnostic system for the partial discharge of the composite bushing that may measure a partial discharge of a composite bushing and thereby prevent a safety accident of the composite bushing.

DETAILED DESCRIPTION

Figure 1:
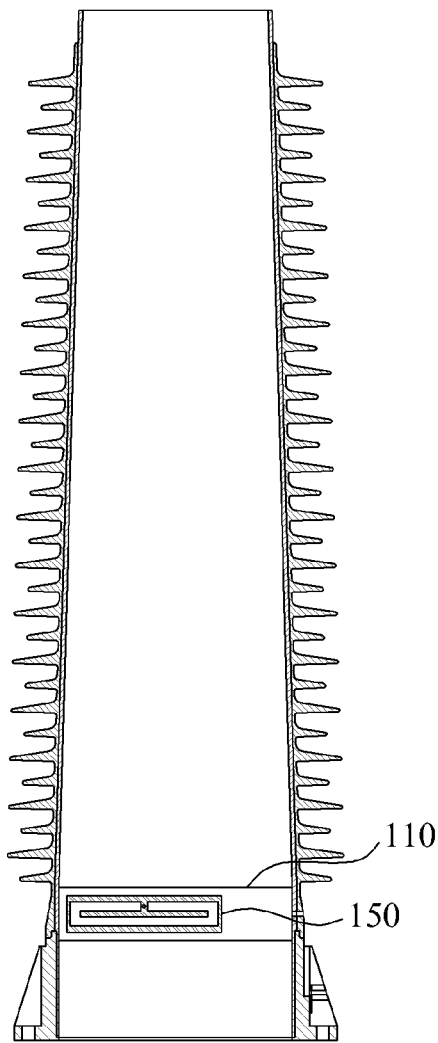
FIG. 1 is a sectional view illustrating a composite bushing according to an embodiment of the present invention.

Reference will now be made in detail to embodiments of the present invention, examples of which are illustrated in the accompanying drawings, wherein like reference numerals refer to the like elements throughout. The embodiments are described below in order to explain the present invention by referring to the figures.

Hereinafter, a configuration and an operation according to an embodiment of the present invention will be described with reference to the accompanying drawings. The following description will be one of aspects of the present invention and constitute a portion of the detailed description of the present invention. When describing the present invention, detailed description related to a known function or configuration will be omitted for clarity.

Figure 2:
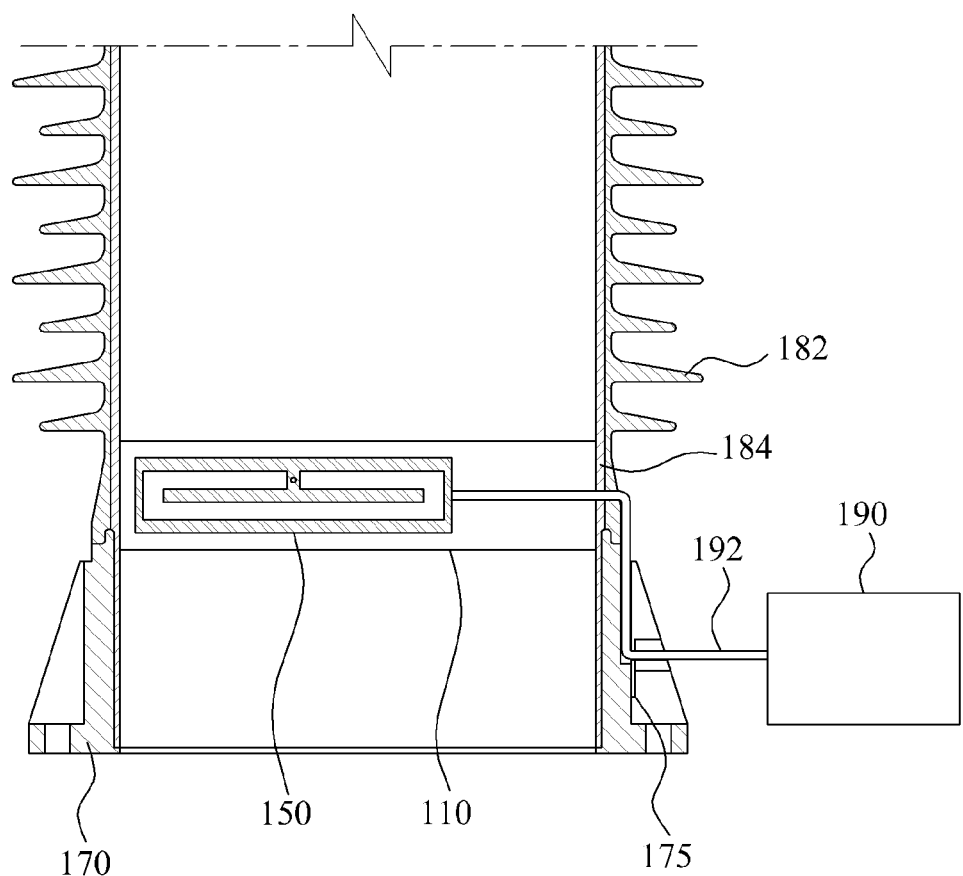
FIG. 2 is a partially enlarged sectional view of the composite bushing of FIG. 1.
Figure 3:
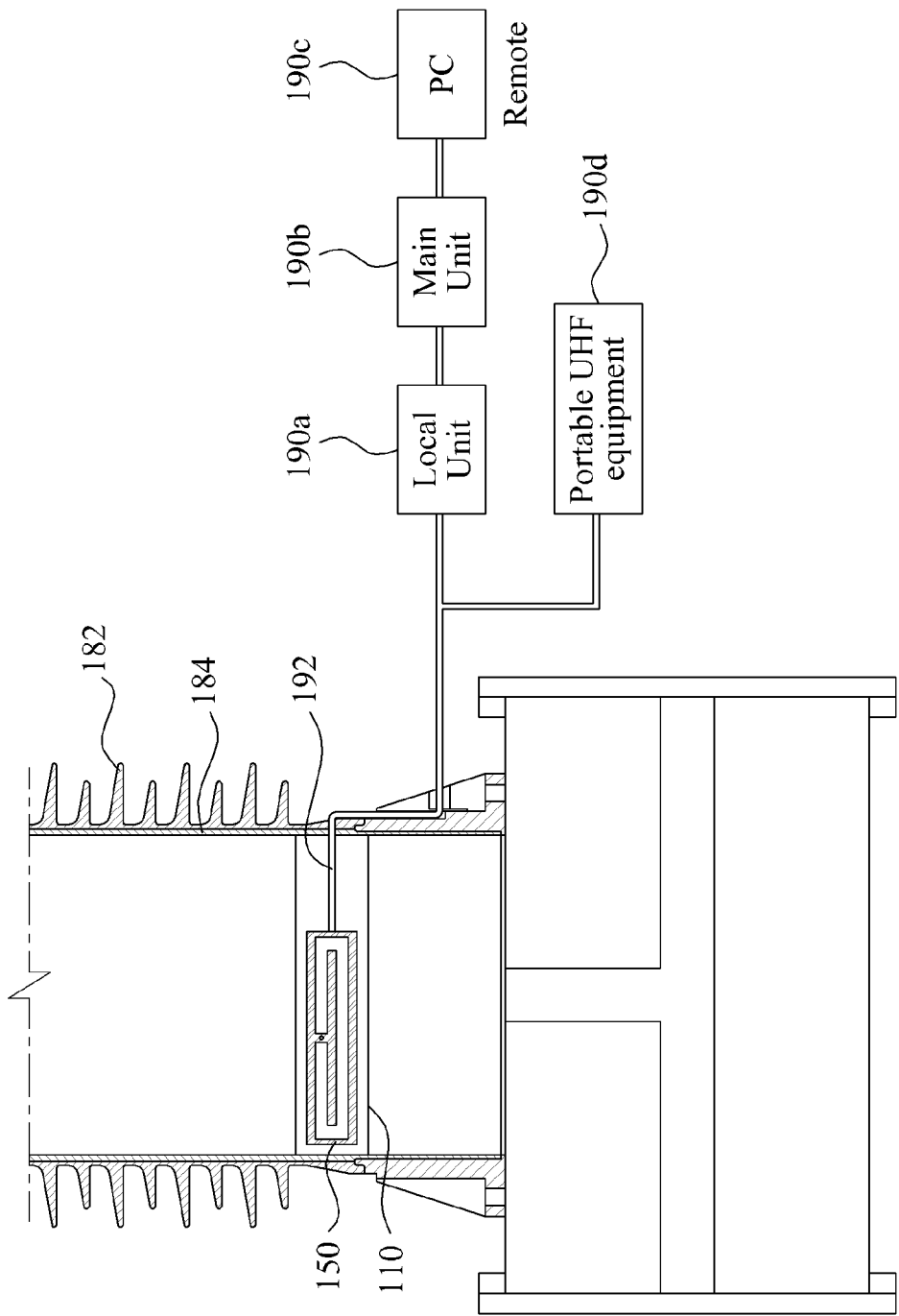
FIG. 3 is a block diagram illustrating a composite bushing according to an embodiment of the present invention.

FIG. 1 is a sectional view illustrating a composite bushing according to an embodiment of the present invention, FIG. 2 is a partially enlarged sectional view of the composite bushing of FIG. 1, and FIG. 3 is a block diagram illustrating a thin-film ultra high frequency (UHF) sensor provided to the composite bushing according to an embodiment of the present invention.

The present invention may be applicable to a composite bushing for a Gas Insulated Switchgear (GIS) and to a live-tank typed bushing or a bushing for an Air Insulated Switchgear (AIS). For example, the present invention may be applicable to a composite hollow bushing used by filling any types of gases including sulphur hexafluoride ($SF_6$) gas therein. Hereinafter, for ease of description, an example of the present invention applied to the composite bushing for the GIS will be described.

Referring to FIG. 1 through FIG. 3, a composite bushing 100 for a GIS according to an embodiment of the present invention may include a fiberglass reinforced plastics (FRP) tube 110 and a silicone rubber to be provide on the FRP tube 110.

A thin-film UHF sensor 150 may be provided on the RFP tube 110. In particular, the thin-film UHF sensor 150 may be provided within the FRP tube 110. Due to the provided thin-film UHF sensor 150, the composite bushing 100 constructed as above may measure a partial discharge that may occur in the composite bushing 100. Also, as a UHF sensor to measure the partial discharge of the composite bushing 100 is formed as the small thin-film UHF sensor 150, the UHF sensor may be provided within the FRP tube 110, thereby reducing a size of a partial discharge sensor.

Also, since the thin-film UHF sensor 150 may be formed in the shape of a band, it is possible to readily install the thin-film UHF sensor 150 in the FRP tube 110. The FRP tube 110 may be formed in a circular shape or an oval shape. Accordingly, to install the thin-film UHF sensor 150 in the FRP tube 110, the thin-film UHF sensor 150 may be formed in the shape of the band to be surrounded by the FRP tube 110.

The composite bushing 100 may include a silicone rubber to be provided on the thin-film UHF sensor 150. For example, the silicone rubber may be provided to enable the FRP tube 110 to be mounted to the composite bushing 100. By performing primer coating (not shown) on the FRP tube 110, it is possible to reinforce the adherence between the FRP tube 110 and the silicone rubber.

The type of the UHF sensor is not limited to the band type. For example, when molding the silicone rubber to be in a shape that can be attached to the FRP tube 110, the UHF sensor having a size and a shape that can be completely covered may be employed. In this instance, a thickness of the silicone rubber to be completely covered may be 4 mm to 5 mm. Since insulation is an important issue, the UHF sensor may be completely covered by the silicone rubber.

The composite bushing 100 may include an output unit 190, electrically connectable to the thin-film UHF sensor 150, to output a signal of the thin-film UHF sensor 150. In this instance, the output unit 190 may withdraw an anode receiver output line 182 and a cathode receiver output line 184 of the thin-film UHF sensor 150. Here, each of the anode receiver output line 182 and the cathode receiver output line 184 may be connected to a Bayonet Neil-Concelman (BNC) connector to thereby sense the partial discharge occurring in the composite bushing 100.

Here, a signal detected at the anode receiver output line 182 may be transmitted to a coaxial cable 192. A signal received at the thin-film UHF sensor 150 due to the partial discharge of the composite bushing 100 may not be attenuated and thereby be transmitted to the output unit 190. Here, the anode receiver output line 182 may measure up to a few GHz high frequency band.

The cathode receiver output line 184 may maintain a ground state with a flange 170 of the composite bushing 100 and thus, it is possible to decrease a fault occurring due to contact with an electrical element within the composite bushing 100.

In particular, the thin-film UHF sensor 150 may be installed in an upper end of a lower flange 175. By installing the thin-film UHF sensor 150 in the upper end of the lower flange 175, the thin-film UHF sensor 150 may be provided in a position adjacent to the anode receiver output line 182 and the cathode receiver output line 184. Accordingly, the thin-film UHF sensor 150 may measure the partial discharge occurring in the composite bushing 100, thereby enhancing the stability of the composite bushing 100.

Figure 4:
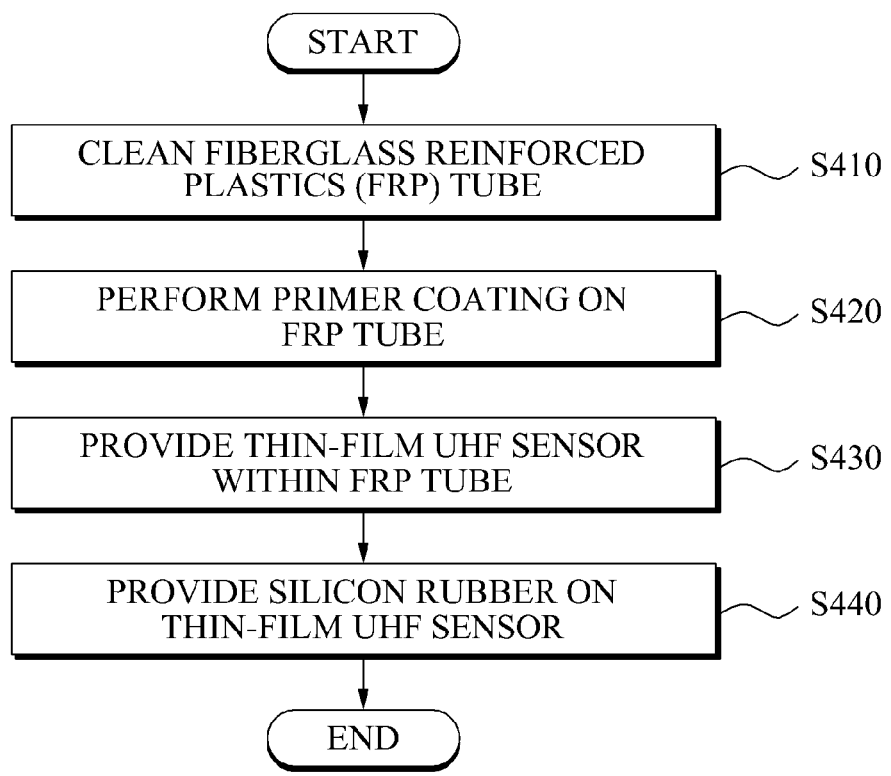
FIG. 4 is a flowchart illustrating a method of manufacturing a composite bushing according to an embodiment of the present invention.

FIG. 4 is a flowchart illustrating a method of manufacturing a composite bushing according to an embodiment of the present invention.

Referring to FIG. 4, the method of manufacturing the composite bushing according to an embodiment of the present invention may include operation 5410 of cleaning and providing an FRP tube, operation S420 of performing primer coating on the FRP tube, operation S430 of providing a thin-film UHF sensor within the FRP tube, and operation S440 of providing a silicone rubber on the thin-film UHF sensor.

Referring to FIG. 1 through FIG. 4, in operation S410, the FRP tube 110 may be formed in a circular shape or an oval shape. When preparing the FRP tube 110 and when operating or managing a cleaning apparatus so that residues may not occur during a manufacturing process, there may be no need to clean the FRP tube 110.

In operation 5430, the thin-film sensor 150 may be formed in the shape of a band. Since the FRP tube 110 may be formed in the circular shape or the oval shape, the thin-film UHF sensor 150 may be formed in the band shape to be surrounded by the FRP tube 110 in order to mount the thin-film UHF sensor 150 to the FRP tube 110.

In particular, the thin-film UHF sensor 150 may be formed in an oval band to avoid electric field concentration. When the thin-film UHF sensor 150 is formed in the oval band, it is possible to prevent an insulation issue that may occur due to the thin-film UHF sensor 150 while the composite bushing 100 is being driven.

Also, operation S430 may include an operation of withdrawing an output line of the thin-film UHF sensor 150. The operation of withdrawing the output line of the thin-film UHF sensor 150 may include an operation of withdrawing the anode receiver output line 182 and the cathode receiver output line 184.

The operation of withdrawing the anode receiver output line 182 and the cathode receiver output line 184 may include an operation of connecting each of the anode receiver output line 182 and the cathode receiver output line 184 to a BNC connector. In the operation of connecting, the cathode receiver output line 182 may be electrically separated from the BNC connector and the anode receiver output line 184 may be electrically connected to the BNC connector.

Here, a signal detected at the anode receiver output line 182 may be transmitted to the coaxial cable 192. A signal received at the thin-film UHF sensor 150 due to the partial discharge of the composite bushing 100 may not be attenuated and thereby be transmitted to the output unit 190. Here, the anode receiver output line 182 may measure up to a few GHz high frequency band.

A signal output by the cathode receiver output line 184 may maintain a ground state with the flange 170 of the composite bushing 100 and thus, it is possible to decrease a fault occurring due to contact with an electrical element within the composite bushing 100.

In FIG. 3, 190*a* corresponds to a local unit, 190*b* corresponds to a main unit, and 190*c* corresponds to a personal computer (PC).

In the case of the composite bushing 100 constructed as above, even though the composite bushing 100 is externally exposed, it is possible to diagnose a partial discharge occurring in the composite bushing 100 by inserting the thin-film UHF sensor 150 within the composite bushing 100. Accordingly, it is possible to prevent the safety accident of the composite bushing 100. In addition, since a UHF sensor measuring a partial discharge in all the parts of the GIS is applicable, it is possible to enhance the reliability of the GIS.

Although a few embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

The invention claimed is:

1. A diagnostic system for a partial discharge of a composite bushing, the system comprising:
   the composite bushing comprising a fiberglass reinforced plastics (FRP) tube, a thin-film ultra high frequency (UHF) sensor being provided on the FRP tube, and a silicone rubber being provided on the thin-film UHF sensor; and
   an output unit being electrically connected to the thin-film UHF sensor to output a signal of the thin-film UHF sensor.

2. The system of claim 1, wherein the FRP tube is formed in a circular shape or an oval shape, and is primer coated for stable attachment with the silicone rubber.

3. The system of claim 1, wherein the thin-film UHF sensor is installed in an upper end of a lower flange of the FRB tube.

4. The system of claim 3, wherein the thin-film UHF sensor is formed in the shape of a band.

5. The system of claim 1, wherein the output unit withdraws an anode receiver output line and a cathode receiver output line of the thin-film UHF sensor.

6. The system of claim 5, wherein each of the anode receiver output line and the cathode receiver output line is connected to a Bayonet Neil-Concelman (BNC) connector to sense the partial discharge of the composite bushing.

7. The system of claim 5, wherein the cathode receiver output line is earthed with a flange of the composite bushing.

* * * * *